(12) United States Patent
Cheah et al.

(10) Patent No.: US 11,527,467 B2
(45) Date of Patent: Dec. 13, 2022

(54) MULTI-CHIP PACKAGE WITH EXTENDED FRAME

(71) Applicant: Intel Corporation, Santa Clara, CA (US)

(72) Inventors: Bok Eng Cheah, Pinang (MY); Seok Ling Lim, Kulim Kedah (MY); Jackson Chung Peng Kong, Pinang (MY); Jenny Shio Yin Ong, Pinang (MY); Kooi Chi Ooi, Pinang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/089,749

(22) Filed: Nov. 5, 2020

(65) Prior Publication Data

US 2022/0068782 A1 Mar. 3, 2022

(30) Foreign Application Priority Data

Sep. 3, 2020 (MY) .............................. PI2020004581

(51) Int. Cl.
*H01L 23/538* (2006.01)
*H01L 23/498* (2006.01)
*H01L 23/00* (2006.01)
*H01L 21/48* (2006.01)
*H01L 23/13* (2006.01)
*H01L 23/552* (2006.01)

(52) U.S. Cl.
CPC .... *H01L 23/49833* (2013.01); *H01L 21/4803* (2013.01); *H01L 21/4853* (2013.01); *H01L 23/13* (2013.01); *H01L 23/5385* (2013.01); *H01L 24/16* (2013.01); *H01L 24/17* (2013.01); *H01L 23/552* (2013.01); *H01L 2224/16225* (2013.01); *H01L 2224/1703* (2013.01)

(58) Field of Classification Search
CPC ....................... H01L 23/49833; H01L 23/5385
See application file for complete search history.

(56) References Cited

U.S. PATENT DOCUMENTS 10,643,983 B2  5/2020 Goh et al.
2015/0270243 A1* 9/2015 Yang ....................... H01L 25/50
                                                      438/118

FOREIGN PATENT DOCUMENTS

CN          107041137 A  *  8/2017  .......... H01L 23/5389

* cited by examiner

*Primary Examiner* — Michele Fan
(74) *Attorney, Agent, or Firm* — Viering, Jentschura & Partner mbB

(57) ABSTRACT

According to the various aspects, a multi-chip semiconductor package includes a package substrate, an interconnect frame extending beyond a first side edge of the package substrate, the interconnect frame including a bottom surface positioned over and coupled to a top surface of the package substrate, a first semiconductor device positioned at least partially over and coupled to the interconnect frame, and a second semiconductor device positioned on the bottom surface of the interconnect frame alongside of the package substrate. The interconnect frame further includes a redistribution layer and a frame construct layer, and a plurality of vias coupled to the redistribution layer, with the frame construct layer further includes a recessed area, and the first semiconductor device is positioned in the recessed area.

13 Claims, 8 Drawing Sheets

MULTI-CHIP PACKAGE WITH EXTENDED FRAME

CROSS-REFERENCE TO RELATED APPLICATIONS

This non-provisional application claims priority to Malaysian Patent Application No. PI2020004581, which was filed on Sep. 3, 2020, which is incorporated by reference herein in its entirety.

BACKGROUND

With the continued miniaturization of 2.5/3D semiconductor packaging, there are challenges of increased package z-height and creating the real-estate footprint needed for the various components in a highly integrated, multi-chip package. The reduced package footprint also causes signal lines/trace routing congestion. In addition, there are concerns from electrical performance impairments, e.g., signal latency, attenuation losses and extensive power loop inductance between the transceiver integrated circuit (IC) die, and electrical performance trade-off due to reference plane (e.g., power supply or ground reference plane) discontinuities. Energy losses along transmission lines and impedance discontinuities may cause signal integrity degradation that can impact the functionality of high data-rate applications, e.g., serial de-serial (SerDes) buses operating at ≥20 GHz (Nyquist frequency) or double data-rate (DDR) memory buses operating at ≥6.4 GHz.

To address some of these concerns, the form-factor miniaturization and/or improved electrical performance solution has included using embedded technology (e.g., embedding active silicon devices and passive devices), passive bridge interconnects, and/or decoupling capacitors architectures. However, for package z-height reduction through embedded active silicon and/or passive devices, there may be an additional challenge of dissipating heat from a crowded package.

BRIEF DESCRIPTION OF THE DRAWINGS

In the drawings, like reference characters generally refer to the same parts throughout the different views. The drawings are not necessarily to scale, emphasis instead being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
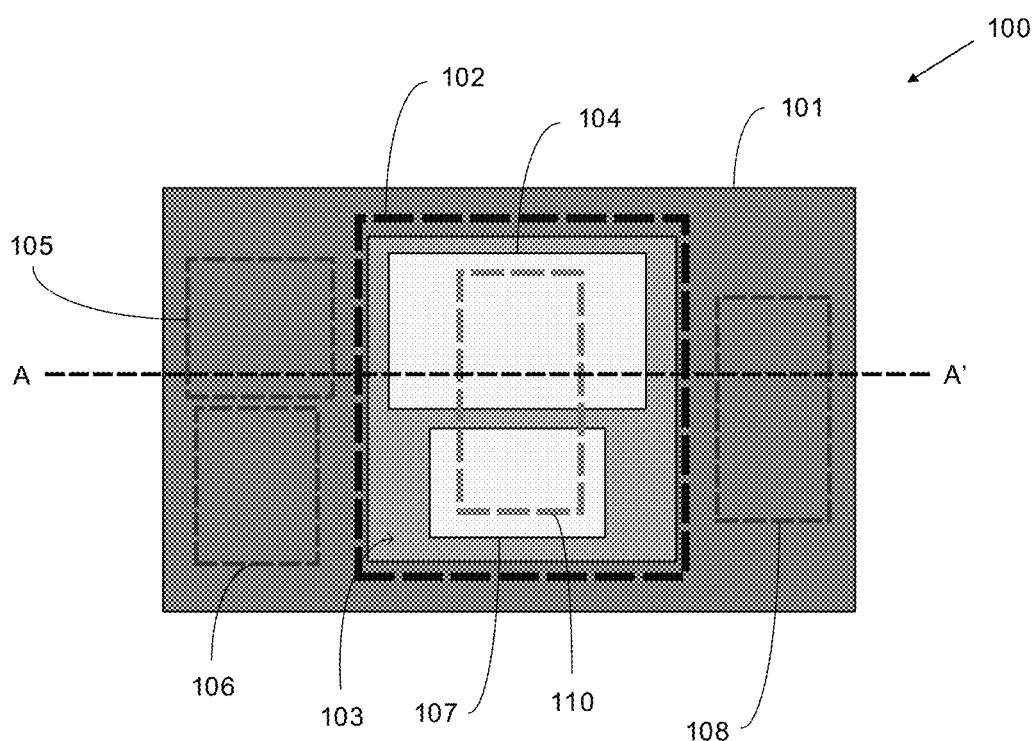
FIG. 1 shows an exemplary top layout view of a semiconductor package according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

According to the present disclosure, a multi-chip semiconductor package may include an interconnect frame with an extended redistribution layer on its bottom surface for high bandwidth interconnects within the package. The interconnect frame may be coupled to a package substrate and may extend beyond at least a first side edge of the package substrate. In an aspect, the interconnect frame may "surround" the package substrate by extending over all of the side edges of the package substrate and have a larger footprint than the package substrate. In an aspect, the package substrate may have a size ranging from 15×15 mm to 75×75 mm square.

The multi-chip semiconductor package may have a first semiconductor device positioned at least partially over and coupled to the interconnect frame and coupled to the package substrate. The interconnect frame further including a recessed area extending from a top surface and the first semiconductor device and additional "recess" semiconductor devices may be positioned in the recess. In another aspect, a plurality of "frame" semiconductor devices may be positioned on the bottom surface of the interconnect frame alongside of the package substrate. In yet another aspect, a plurality of passive device may be embedded in the interconnect frame and coupled to the redistribution layer for improved power delivery, and alternatively, a thermal spreader or electromagnetic shield may be embedded in the interconnect frame or extend between a top and bottom surfaces of the interconnect frame. In a further aspect, the embedded devices may be positioned adjacent to the thermal spreader or electromagnetic shield, e.g., one or more embedded devices may be positioned in an area between a recess in the interconnect frame and a thermal spreader or electromagnetic shield.

The technical advantages of the present disclosure include, without limitation: (1) platform miniaturization through a reduced package substrate footprint and overall device thickness, with chiplets or devices disposed on the interconnect frame, which reduces package substrate real-estate requirement; (2) improved device performance through higher die-to-die interconnects bandwidth density and shorter interconnects between chiplets and/or between die to chiplets (i.e., reduction in signal latency, attenuation losses), and improved power integrity (i.e., reduced power loop inductance between decoupling capacitors and the power delivery network of the devices); and/or (3) improved thermal dissipation with the use of an integrated heat spreader and/or thermal interface layer.

According to an aspect of the present disclosure as shown FIG. 1, an exemplary top layout view of a semiconductor package 100 includes an interconnect frame 101 that may have a recessed area 103 and beneath the interconnect frame 101 may be a package substrate 102 (represented as dashed lines). In this aspect, a first semiconductor device or die 104 and an additional recess semiconductor device or die 107 may be positioned in the recessed area 103, and under the first semiconductor device 104 and the additional recess semiconductor device 107 may be a cavity 110 (represented as dashed lines). Also beneath the interconnect frame 101 may be a second semiconductor device or chiplet 105 and additional frame semiconductor devices or chiplets 106 and 108 (all represented by dashed lines).

Figure 1A:
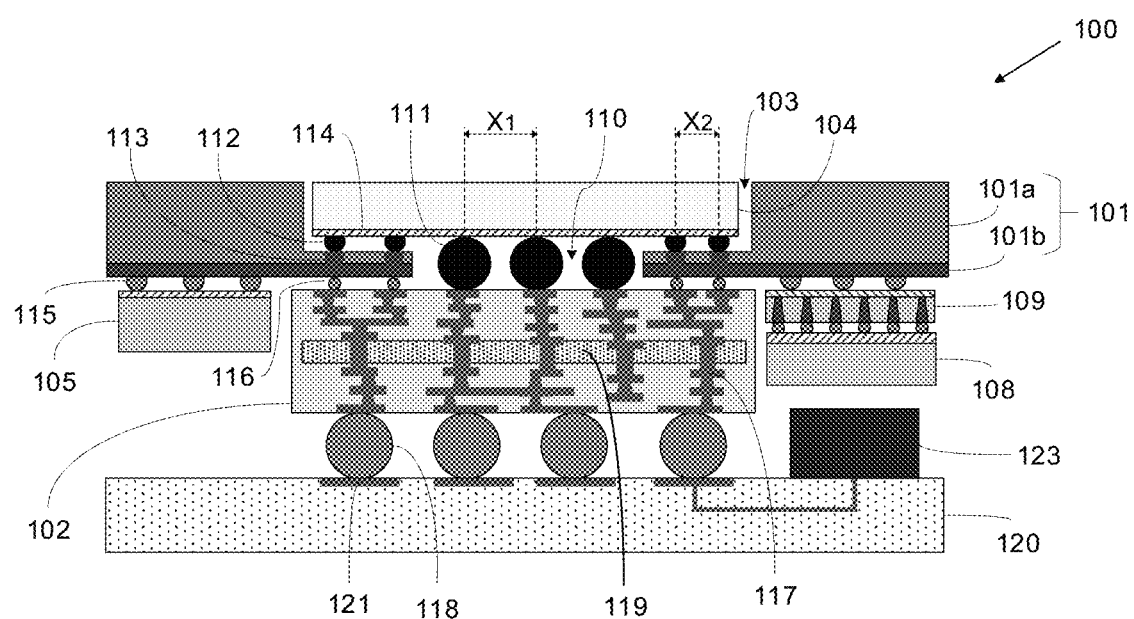
FIG. 1A shows a cross-sectional view along an A-A' line of the semiconductor package shown in FIG. 1.

In FIG. 1A, a cross-sectional view of the semiconductor package 100, as shown in FIG. 1, is provided along a cross-sectional A-A' line. In this aspect, the interconnect frame 101 includes two layers, i.e., a frame construct layer 101a, and a redistribution layer 101b, with the cavity 110 in the recessed area 103 forming an opening through these layers to the package substrate 102 below. In an aspect, the frame construct layer 101a may be a non-conductive layer (e.g., glass, a dielectric, a silicon substrate, a molded organic material, etc.), or a conductive layer (e.g., a metal, a metal alloy, a semiconductor, etc.). In an aspect, the interconnect frame may have a thickness in the range of 200 to 400 um, and the redistribution layer may have a thickness in the range of 10 to 50 um.

In another aspect, the recessed area 103 may provide the first semiconductor device 104 with a depth that lowers the z-height of the semiconductor package 100, and depending on the thickness of the frame construct layer 101a, the first semiconductor device 104 may have a height that may be level with a top surface of the interconnect frame 101. In an aspect, the recessed area 103 may have a depth in the range of 30 to 70 percent of the total thickness of the interconnect frame.

As also shown in FIG. 1A, the first semiconductor device 104 has a metallization layer 114 that may be coupled to a plurality of recess solder bumps 112, which are coupled by recess vias 113 to the redistribution layer 101b, and to a plurality of cavity solder bumps 111, which are coupled to the package substrate 102. It should be understood that the additional recess semiconductor 107, as well as any other additional recess semiconductor device similarly situated, may also be coupled together with the first semiconductor device 104.

In another aspect, the second semiconductor device 105 and additional frame semiconductor devices 108 and 106 (not shown) may be coupled to the redistribution layer 101b by a plurality of solder bumps 115. The second semiconductor device 105 may include, without limitation, a system-on-chip (SOC), a CPU core, a field programmable gate array (FPGA), or an accelerator. The additional frame device 108 may be a stacked chiplet (e.g., a DRAM memory or a high-bandwidth memory) with an interposer 109, as an intermediate element, coupled to the redistribution layer 101b. The second semiconductor device 105 and the additional frame semiconductor device 108 may be positioned alongside of the package substrate 102, which reduces the component footprint for the semiconductor device 100. In an aspect, the package substrate 102 may be coupled to the redistribution layer 101b by a plurality of small substrate solder bumps 116, which have a geometry that is smaller than the cavity solder bumps 111, to facilitate signal, power supply and/or ground reference voltage (Vss) connection.

In a further aspect, the geometry of the cavity solder bumps may include a bump pitch X1 (i.e., the distance between centers of two adjacent bumps) in the range of 80 µm to 200 µm. In another aspect, the small substrate solder bumps 116 may have a bump pitch X2 in the range of 10 µm to 60 µm.

In a further aspect shown in FIG. 1A, the package substrate 102 may have a plurality of micro-vias 117. The micro-vias 117 may be coupled to solder balls 118, which are coupled to contact pads 121 on a motherboard or printed circuit board 120. In addition, the substrate 102 may include one or more rigid core layer 119 for improved mechanical performance, i.e., high rigidity for improved package substrate warpage control. In alternative aspects of the present disclosure, the package substrate may be a coreless substrate, which may provide further miniaturization of the form-factor and improved electrical performance due to reduced package stack-up geometry, minimized impedance discontinuities and signal return losses.

In yet another aspect, an electronic component 123 (e.g., a capacitor, an inductor, a resistor, etc.), may be positioned on the motherboard 120 under the additional frame device 108 to further reduce the size of the motherboard.

Figure 2:
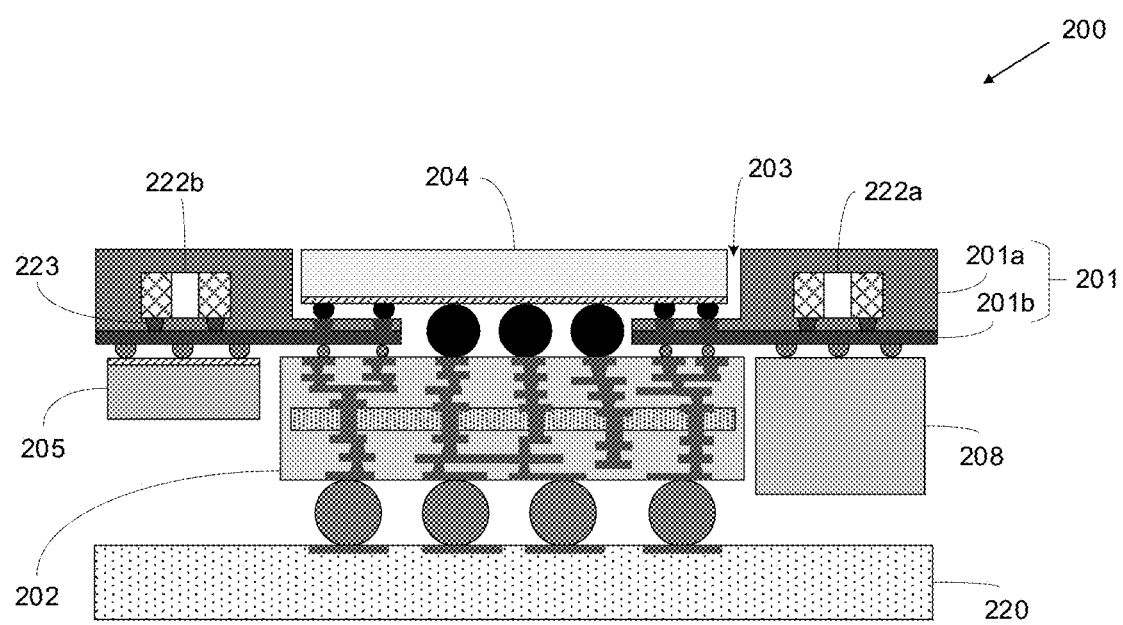
FIG. 2 shows a cross-sectional view of another exemplary semiconductor package according to an aspect of the present disclosure.

FIG. 2 shows a cross-sectional view of another exemplary semiconductor package according to an aspect of the present disclosure. In this aspect, an interconnect frame 201 includes two layers, a frame construct layer 201a, and a redistribution layer 201b, with a recessed area 203 formed in the frame construct layer 201a layer. A first semiconductor die 204 may be placed in the recessed area 203 and coupled to a package substrate 202 positioned below, which may, in turn, be coupled to a printed circuit board positioned further below according to an aspect of the present disclosure.

In the aspect of FIG. 2, the frame construct layer 201a of the interconnect frame 201 includes embedded electronic components 222a and 222b, which are coupled to the redistribution layer 201b. The embedded electronic components 222a and 222b may be passive devices. For example, the passive devices may include capacitors, resistors, inductors, transformers, and some diodes, as being within the scope of the present disclosure.

In an aspect of the present disclosure, the passive device may be a decoupling capacitor; specifically, it may be a ceramic or silicon capacitor. Also coupled to the redistribution layer 201b may be a second semiconductor chiplet 205 and an electronic component 208, which, for example, may be a voltage regulator module. In this aspect, a reduced power AC loop inductance and improved power integrity may be achieved through direct and/or shortened distance between the decoupling capacitor and/or voltage regulator module and the active semiconductor devices (i.e., first die and/or chiplets).

Figure 3:
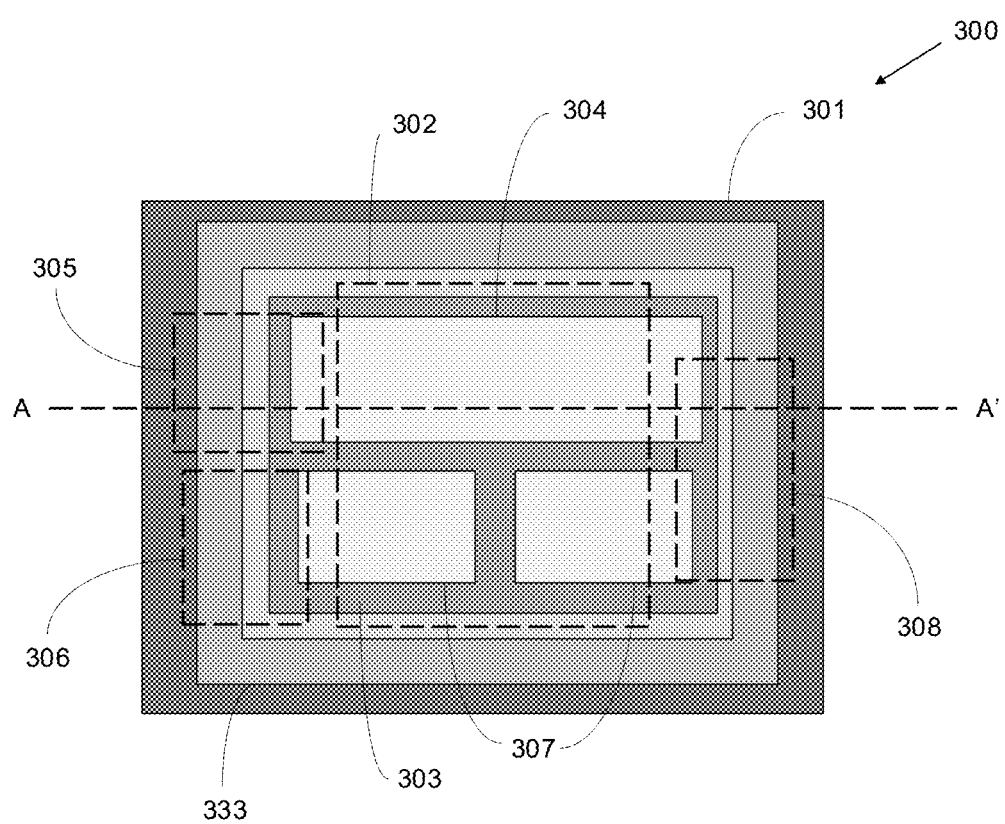
FIG. 3 shows an exemplary top layout view of a semiconductor package according to another aspect of the present disclosure.

As shown in FIG. 3, according to another aspect of the present disclosure, an exemplary top layout view of a semiconductor package 300 includes an interconnect frame 301 that may have a recessed area 303 and beneath the interconnect frame 301 may be a package substrate 302 (represented as dashed lines). The recessed area 303 may extend beyond two side ends of the package substrate 302, and may, in other aspects within the scope of the present disclosure, extend beyond all four sides of a package substrate.

In the aspect of FIG. 3, a first semiconductor device or die 304 and two additional recess semiconductor devices or dies 307 may be positioned in the recessed area 303, and under the first semiconductor device 304 and the two additional recess semiconductor devices 307 may be a cavity (not shown). The first semiconductor device 304 in the recessed area 303 may also extend beyond two side ends of the package substrate 302 as shown. Also beneath the interconnect frame 301 may be a second semiconductor device or chiplet 305 and additional frame semiconductor devices or chiplet 308 (both represented by dashed lines).

Figure 3A:
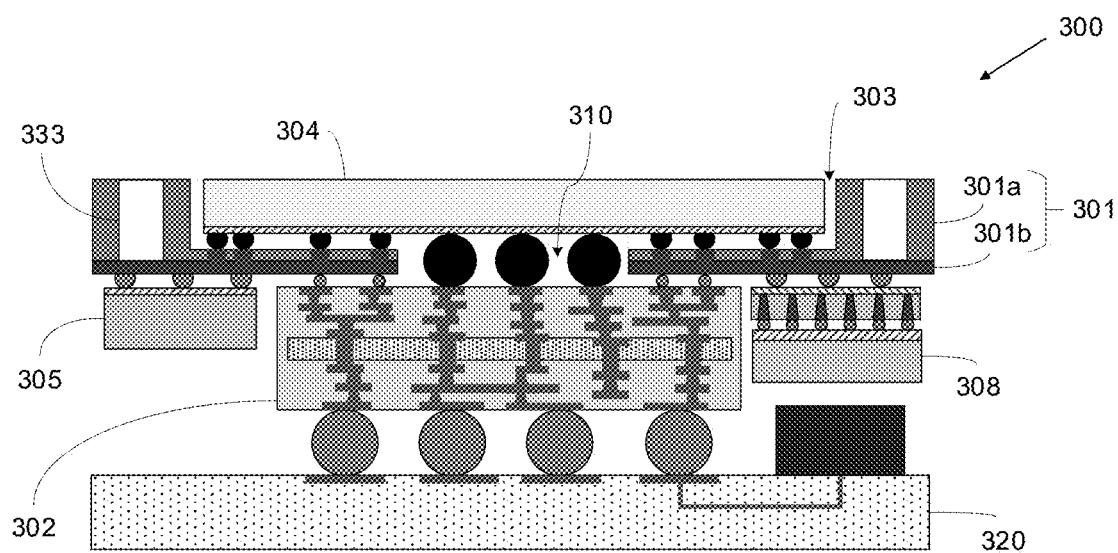
FIG. 3A shows a cross-sectional view along an A-A' line of the semiconductor package shown in FIG. 3.

In addition, as shown in FIGS. 3 and 3A, an element 333 may be integrated into the interconnect frame 301 and may be, for example, a thermal spreader or an electromagnetic shield. The element 333 may be made of a metal or metal alloy and may be positioned surrounding the first semiconductor device 304 and additional recess devices 307 according to an aspect of the present disclosure. In another aspect, the element 333 may be extended between a top surface and a bottom surface of the interconnect frame 301 through the redistribution layer 301b.

FIG. 3A shows a cross-sectional view along an A-A' section line of the semiconductor package shown in FIG. 3. In this aspect, the interconnect frame 301 includes a frame construct layer 301a and a redistribution layer 301b, with the cavity 310 in the recessed area 303 forming an opening through these layers to the package substrate 302, which is coupled to a motherboard 320. The second semiconductor device 305 and additional frame semiconductor devices 308 and 306 (not shown) may be coupled to the redistribution layer 301b on its bottom surface alongside of the package substrate 302.

Further to the aspect shown in FIG. 3A, portions of the recessed area 303 and portions of the first semiconductor device 304 may extend beyond the side edges of the package substrate 302. In this aspect, the portions of the first semiconductor device extending beyond the side edges of the package substrate may be positioned over the second semiconductor device 305 and additional frame semiconductor devices 308 and 306 (not shown) that may be alongside of the package substrate 302. It should be understood that a recess area and a first semiconductor device may extend beyond only one side edge of a package substrate according to the present disclosure.

In addition, the aspect shown in FIG. 3A, the element 333 may be integrated into the interconnect frame 301, with element 333 having a thickness equal to the frame construct layer 301a and attached to the redistribution layer 301b. If the element 333 is a heat spreader, it may be connected by a thermal interface material to a heat sink or other integrated heat spreader adjacent to the top surface. If the element 333 is an electromagnetic shield, it may be coupled to a reference voltage, e.g., a ground (Vss) reference voltage, through the redistribution layer to shield the semiconductor devices in the recessed area 303 from electromagnetic noise coupling and/or interference. In another aspect, a second element 333' (not shown) may be configured within the frame construct layer 301a and spaced apart from the element 333. In an aspect, the second element 333' may be disposed in between the element 333 and the recessed area 303 and coupled to a second reference voltage, e.g., a power supply (Vcc) reference voltage.

FIGS. 4A through 4H provide cross-sectional views directed to an exemplary process flow for a semiconductor package according to an aspect of the present disclosure. The fabrication methods and the choice of materials are intended to enhance semiconductor package miniaturization through reducing package substrate footprints and overall device thickness, with chiplets and other electronic components disposed on an interconnect frame, for high-speed (>20 GHz) applications and other applications. It will be apparent to those ordinary skilled practitioners that the process operations disclosed hereinbelow may be modified without departing from the scope of the present disclosure.

Figure 4A:
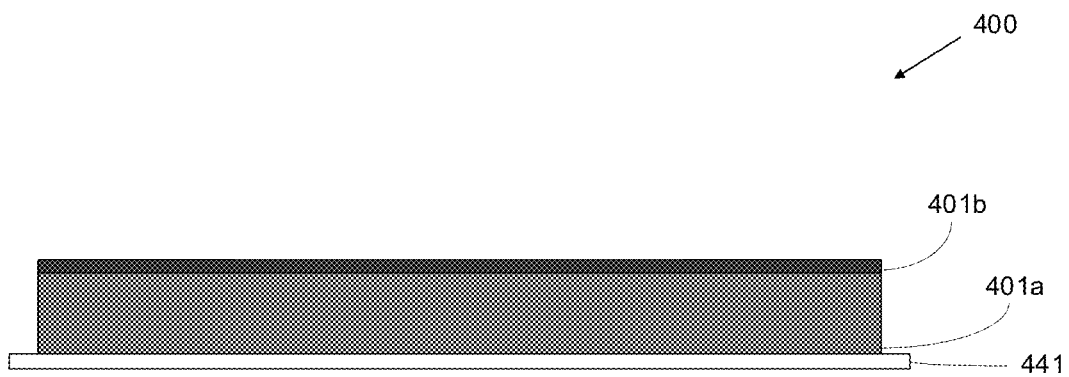
FIGS. 4A through 4H show an exemplary process flow to assemble a semiconductor package according to an aspect of the present disclosure.

In FIG. 4A, an interconnect frame 401 having a redistribution layer 401b formed on frame construct layer 401a is placed on a first carrier 440. The frame construct layer 401a may be a silicon substrate or a molded single layer (or laminate) of organic materials, including epoxy resins, polyester resin, and vinyl ester. The redistribution layer 401b may be formed by a standard metal build-up process, e.g., a photolithography (plating/etching) process.

Figure 4B:
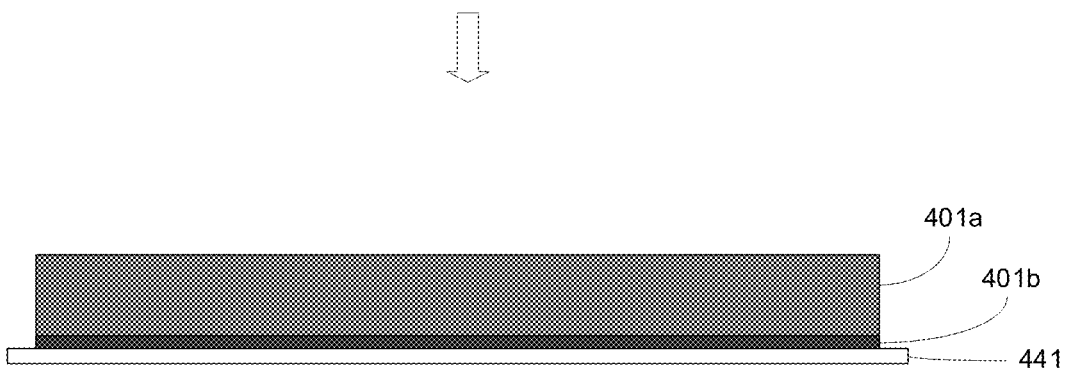

In FIG. 4B, the interconnect frame 401 may be inverted to have the frame construct layer 401a on top and the redistribution layer 401b placed on a second carrier 441.

Figure 4C:
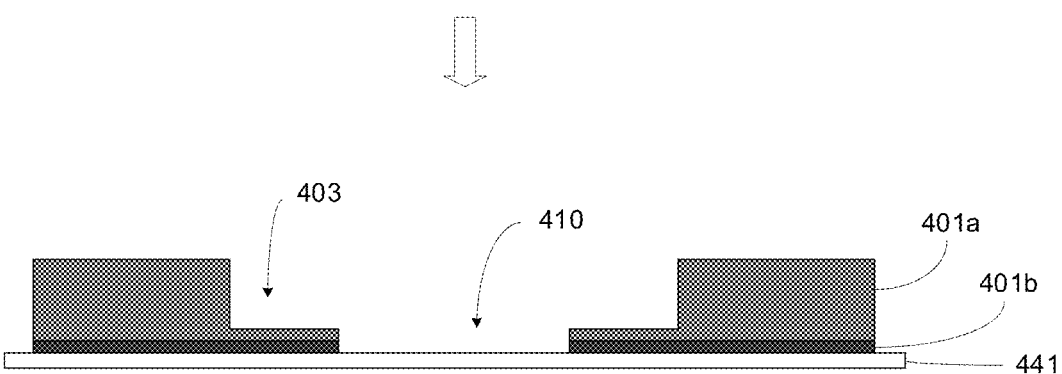

In FIG. 4C, a portion of the frame construct layer 401a may be removed to form a recessed area 403, and in the recessed area 403, a further portion of the frame construct layer 401a and the redistribution layer 401b may be removed to expose a surface of the second carrier 441 to form a cavity 410. The recessed area 403 and the cavity 410 may be formed by a laser or mechanical drilling processing step, as a single step or two separate steps. It is also possible to use reactive ion etching to form these openings.

Figure 4D:
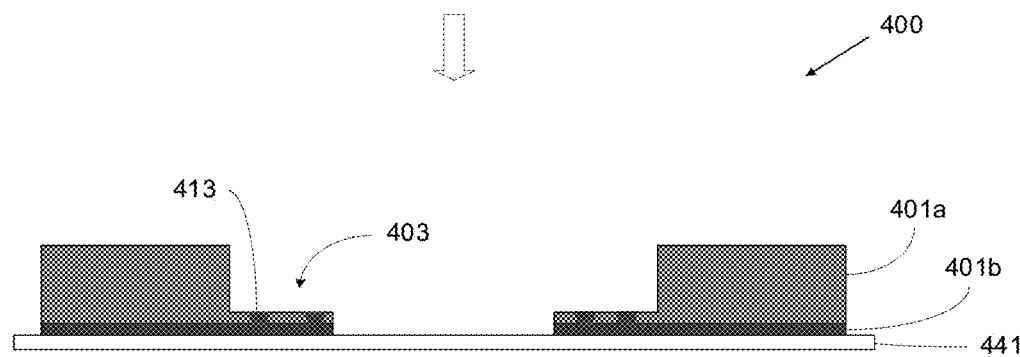

In FIG. 4D, a plurality of via openings are formed in the recessed area 403 using a laser or mechanical drilling process and via openings may be filled with a conductive material by an electroplating process to form a plurality of recess vias 413, which may be coupled to the redistribution layer 401b.

Figure 4E:
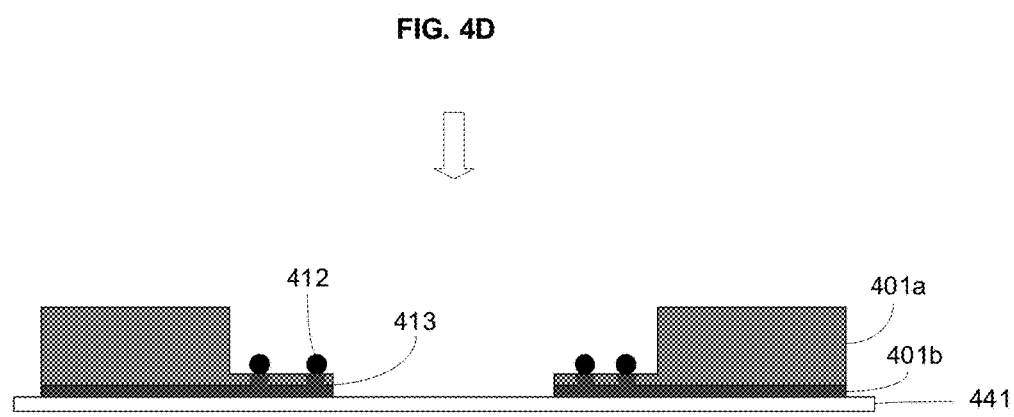

In FIG. 4E, recess solder bumps 412 may be formed on the plurality of recess vias 413 using a standard solder reflow process.

Figure 4F:
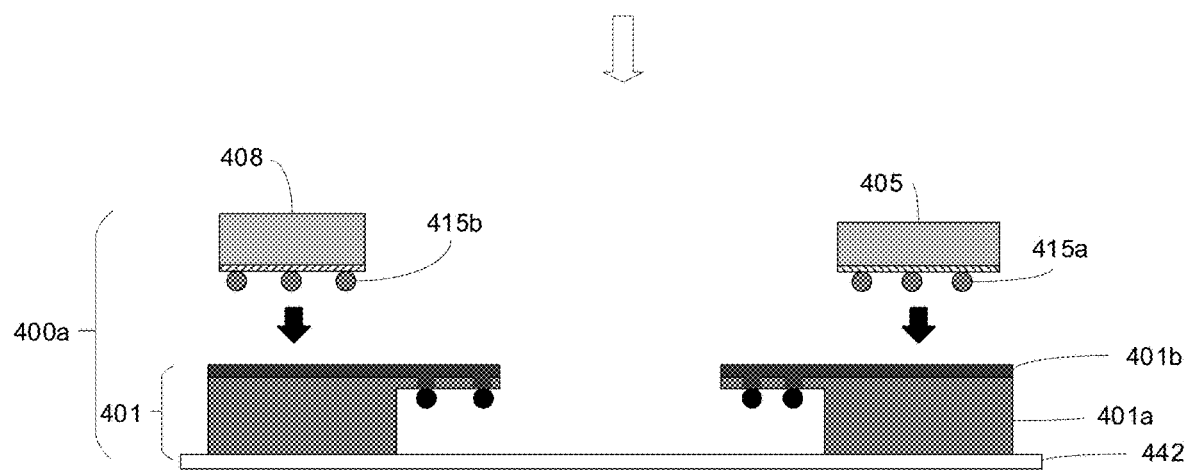

In FIG. 4F, the interconnect frame 401 may be removed from the second carrier 441 and inverted for placement on a third carrier 442. Thereafter, a second semiconductor device 405 and an additional frame semiconductor device 408, with pre-positioned solder bumps 415a and 415b, respectively, may be aligned and coupled onto the redistribution layer 401b. The second semiconductor device 405 and the additional frame semiconductor device 408 may be coupled using a standard thermal compression bonding and/or solder reflow process. It should be understood that other additional frame devices (not shown) may also be coupled to the redistribution layer 401b during this attachment process. This intermediate assembly will be referred to as 400a.

Figure 4G:
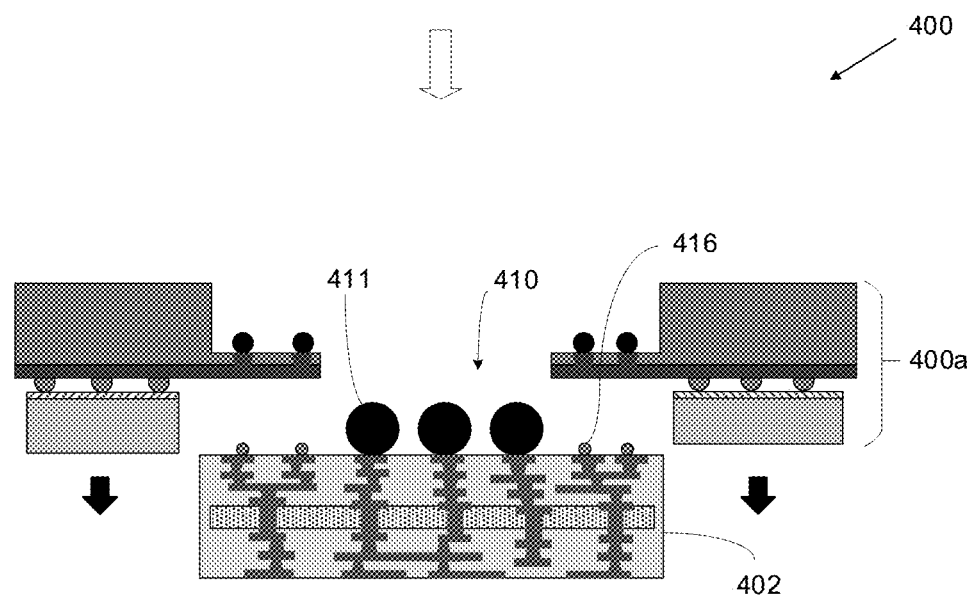

In FIG. 4G, the intermediate assembly 400a may be removed from the third carrier 442 and inverted for coupling to a provided package substrate 402. The package substrate 402 may include a plurality of small substrate solder bumps 416 and a plurality of cavity solder bumps 411, which are larger than the substrate solder bumps. In this aspect, the intermediate assembly 400a may be aligned for coupling with the package substrate 402 to position the plurality of cavity solder balls in the cavity 410 and the second semiconductor device 405 and the additional frame semiconductor device 408 alongside of the package substrate 402. The intermediate assembly 400a and the package substrate 402 may be coupled using a standard thermal compression bonding and/or solder reflow process.

Figure 4H:
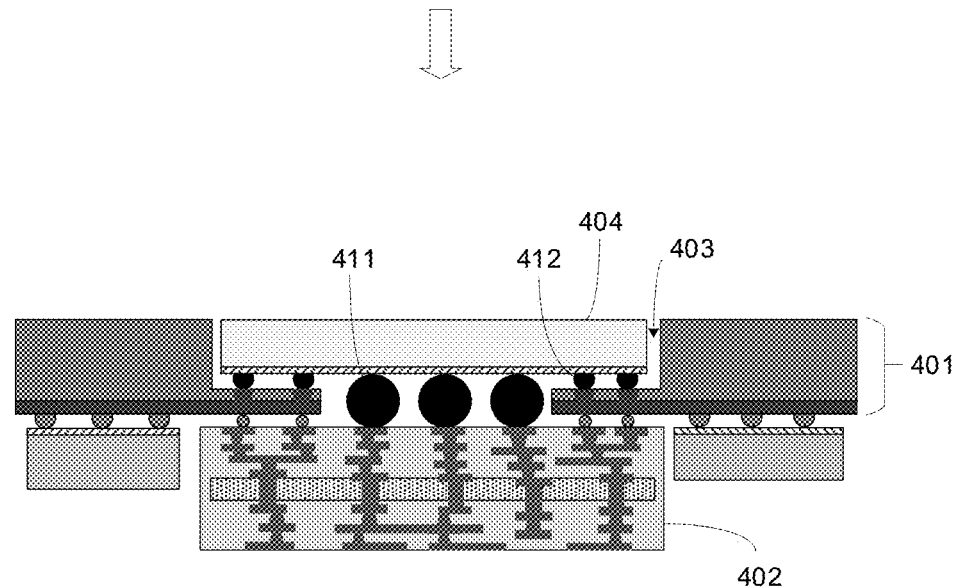

In FIG. 4H, a first semiconductor die 404 may be positioned in the recessed area 403 and aligned with the recess solder bumps 412 and the cavity solder bumps for coupling with the package substrate 402 and the interconnect frame 401, respectively. The coupling of the first semiconductor die 404 may be carried out using a standard thermal compression bonding and/or solder reflow process.

Figure 5:
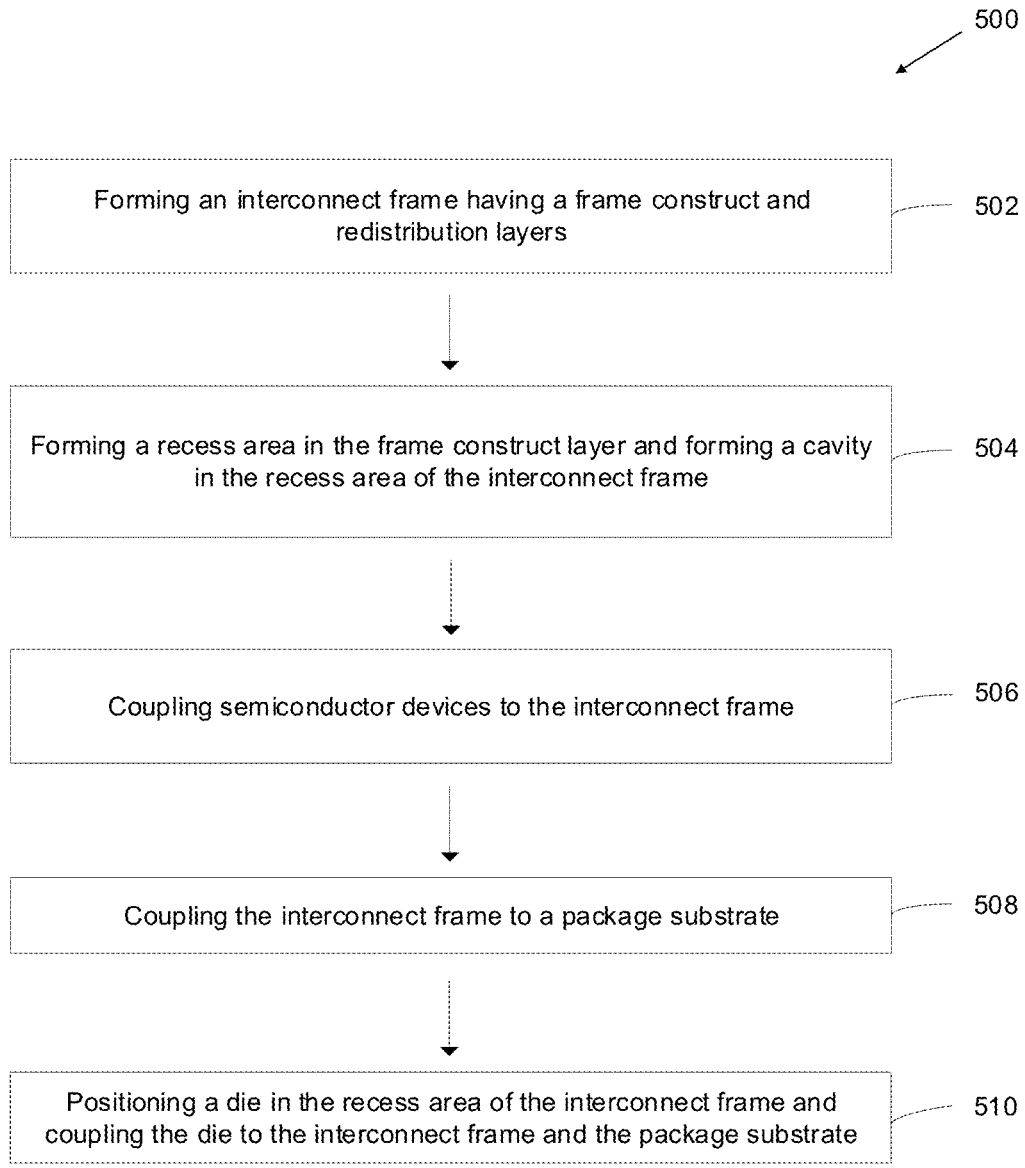
FIG. 5 shows a simplified flow diagram for an exemplary method according to an aspect of the present disclosure.

FIG. 5 shows a simplified flow diagram for an exemplary method according to aspects of the present disclosure encompassing the assembly process shown in FIGS. 4A through 4H.

The operation 502 may be directed to forming a interconnect frame having a frame construct and redistribution layers.

The operation 504 may be directed to forming a recessed area in the frame construct layer and forming a cavity in the recessed area of the interconnect frame.

The operation 506 may be directed to coupling semiconductor devices to the interconnect frame.

The operation 508 may be directed to coupling the interconnect frame to a package substrate.

The operation 510 may be directed to positioning a die in the recessed area of the interconnect frame and coupling the die to the interconnect frame and the package substrate.

Figure 6:
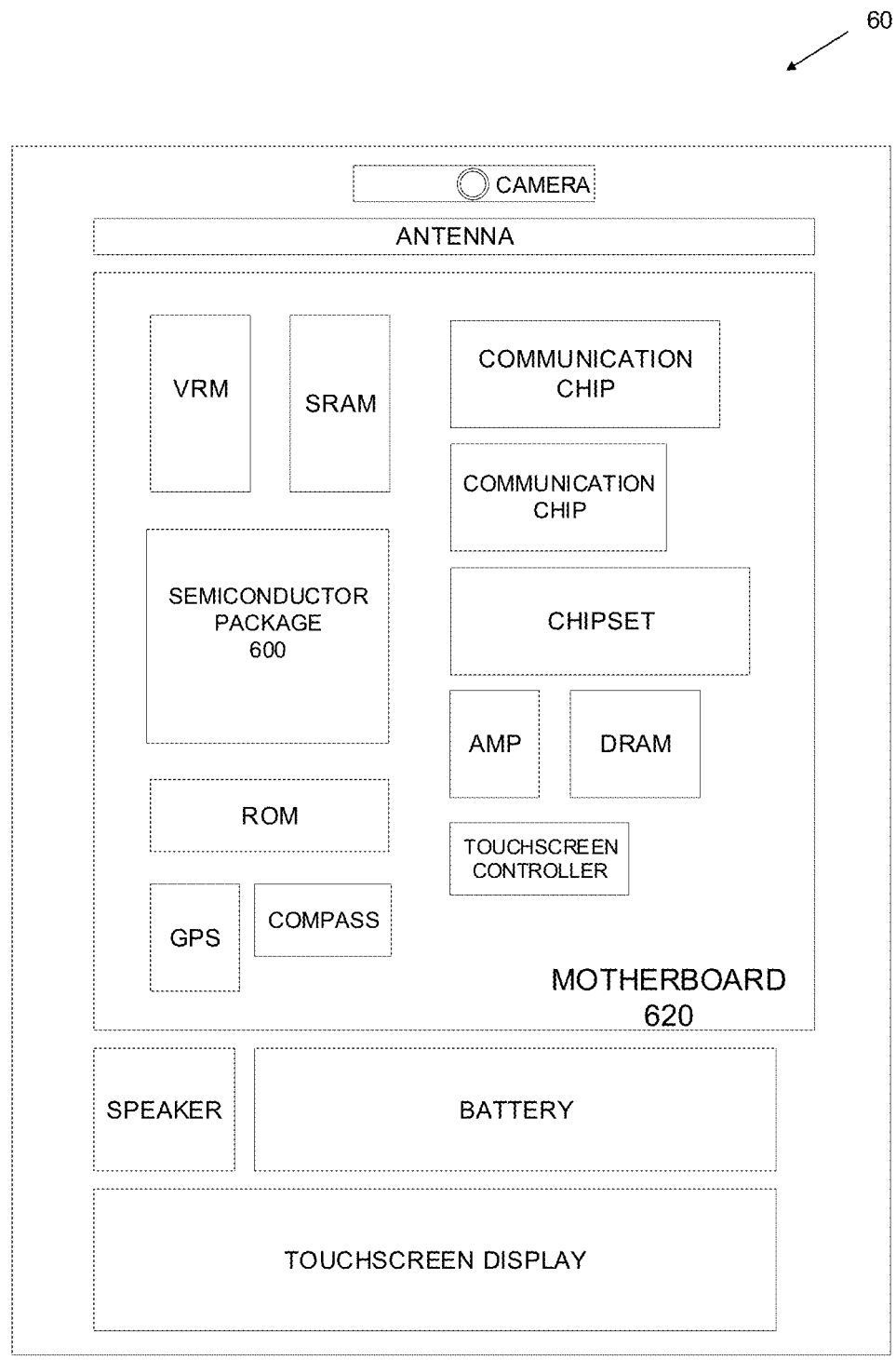
FIG. 6 shows an exemplary computing device according to an aspect of the present disclosure.

FIG. 6 shows an exemplary computing device 60 having a multi-chip semiconductor package 600 with an interconnect frame within the package according to various aspects of the present disclosure. In various implementations, the computing device 60 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 60 may be a mobile computing device. In further implementations, the computing device 60 may be any other electronic device that processes data.

In a further aspect, the computing device 60 may have a board, such as a motherboard 620, having several components, including, but not limited to, a semiconductor processor that may or may not be physically and electrically coupled to such motherboard 620. The other components may include, but are not limited to, volatile memory (e.g., DRAM), non-volatile memory (e.g., ROM), flash memory, a graphics processor, a digital signal processor, a crypto-processor, a communication chip, a chipset, an antenna, a display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). It is within the scope of the present disclosure to use, for example, a multi-chip semiconductor package with an interconnect frame within the package in other components set forth above.

According to the present disclosure, the computing device 60 using a multi-chip semiconductor package with an interconnect frame within the package may include a plurality of communication chips. The communication chips may also operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip may operate in accordance with other wireless protocols in other aspects. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

In another aspect, the communication chip may enable wireless communications for the transfer of data to and from the computing device 60. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not.

The communication chip may implement any of several wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

To more readily understand and put into practical effect the present method and device for, particular aspects will now be described by way of examples. For the sake of brevity, duplicate descriptions of features and properties may be omitted.

EXAMPLES

Example 1 may include a device including a package substrate, an interconnect frame extending beyond a first side edge of the package substrate, the interconnect frame including a bottom surface positioned over and coupled to a top surface of the package substrate, a first semiconductor device positioned at least partially over and coupled to the interconnect frame, and a second semiconductor device positioned on the bottom surface of the interconnect frame alongside of the package substrate.

Example 2 may include the device of example 1 and/or any other example disclosed herein, in which the interconnect frame further includes a redistribution layer and a frame construct layer, and a plurality of vias coupled to the redistribution layer, in which the first device is coupled to the plurality of vias for connection to the redistribution layer and second semiconductor is coupled to the redistribution layer through a plurality of solder bumps.

Example 3 may include the device of example 2 and/or any other example disclosed herein, in which the frame construct layer further includes a recessed area, in which some of the plurality of vias are positioned in the recess, and the first semiconductor device positioned in the recessed area and coupled to the vias in the recessed area.

Example 4 may include the device of example 3 and/or any other example disclosed herein, further including a portion of the recessed area and a portion of the first semiconductor device extending beyond the at least one side edge of the package substrate.

Example 5 may include the device of example 4 and/or any other example disclosed herein, in which the portion of the first semiconductor device extending beyond the at least one side edge of the package substrate is positioned over the second semiconductor device.

Example 6 may include the device of example 2 and/or any other example disclosed herein, further including the interconnect frame forming an extension platform for the package substrate extending beyond at least a second side edge of the package substrate and the recessed area includes a cavity exposing the top surface of the package substrate.

Example 7 may include the device of example 3 and/or any other example disclosed herein, in which the frame construct layer further includes an embedded passive device.

Example 8 may include the device of example 3 and/or any other example disclosed herein, the frame construct layer further includes an integrated heat spreader.

Example 9 may include the device of example 3 and/or any other example disclosed herein, in which the frame construct layer further includes an integrated electromagnetic shield.

Example 10 may include the device of example 7 and/or any other example disclosed herein, in which the first semiconductor device is positioned at least partially over the cavity, further including a plurality of solder bumps positioned in the cavity coupling the first semiconductor device to the top surface of the package substrate.

Example 11 may include the device of example 10 and/or any other example disclosed herein, further including one or more additional recess semiconductor devices positioned in the recess and at least partially over the cavity, in which the plurality of solder bumps couples the first semiconductor device and the one or more additional semiconductor devices to the top surface of the package substrate.

Example 12 may include the device of example 7 and/or any other example disclosed herein, further including one or more additional frame semiconductor devices coupled to the bottom surface of the interconnect frame alongside of the package substrate.

Example 13 may include the device of example 7 and/or any other example disclosed herein, further including an interposer coupled to the bottom surface of the interconnect frame alongside of the package substrate.

Example 14 may include a computing device including a printed circuit board, a package substrate coupled to the printed circuit board, the package substrate including an interconnect frame extending beyond at least one side edge of the package substrate, the interconnect frame including a bottom surface positioned over and coupled to a top surface of the package substrate, a first semiconductor device positioned at least partially over and coupled to the interconnect frame, and a second semiconductor device positioned on the bottom surface of the interconnect frame alongside of the package substrate.

Example 15 may include the computing device of example 14 and/or any other example disclosed herein, in which the interconnect frame further includes a redistribution layer and a frame construct layer, and a plurality of vias coupled to the redistribution layer, in which the first device is coupled to the plurality of vias for connection to the redistribution layer and second semiconductor is coupled to the redistribution layer through a plurality of solder bumps.

Example 16 may include the computing device of example 15 and/or any other example disclosed herein, in which the frame construct layer further includes a recess area, in which some of the plurality of vias are positioned in the recess, and the first semiconductor device positioned in the recessed area and coupled to the vias in the recessed area.

Example 17 may include the computing device of example 16 and/or any other example disclosed herein, further including the interconnect frame forming an extension platform for the package substrate extending beyond at least a second side edge of the package substrate, the recessed area including a cavity exposing the top surface of the package substrate, in which the first semiconductor device is positioned partially over the cavity, and a plurality of solder bumps positioned in the cavity coupling the first semiconductor device to the top surface of the package substrate.

Example 18 may include a method including providing a package substrate, forming an interconnect frame, coupling a second semiconductor device to a bottom surface of the interconnect frame, coupling the interconnect frame to a top surface of the package substrate to position the second semiconductor alongside of the package substrate, and coupling a first semiconductor device to the top surface of the package substrate and to a portion of the interconnect frame.

Example 19 may include the method of example 18 and/or any other example disclosed herein, in which forming the interconnect frame further includes providing a frame construct layer, forming a redistribution layer on the frame construct layer, the redistribution layer including a plurality of metallization layers, in which the second semiconductor device and the package substrate are coupled to the redistribution layer.

Example 20 may include the method of example 19 and/or any other example disclosed herein, in which The method of claim 19, in which forming the interconnect frame further includes forming a recess area in the frame construct layer and forming a cavity in the recessed area that opens through the frame construct and the redistribution layers of the interconnect frame.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
a package substrate;
an interconnect frame extending beyond a first side edge of the package substrate, the interconnect frame comprising a bottom surface positioned over and coupled to a top surface of the package substrate;
a first semiconductor device positioned at least partially over and coupled to the interconnect frame; and
a second semiconductor device positioned on the bottom surface of the interconnect frame alongside of the package substrate;
wherein the interconnect frame further comprises a redistribution layer and a frame construct layer;
further comprising a plurality of vias coupled to the redistribution layer, wherein the first device is coupled to the plurality of vias for connection to the redistribution layer and second semiconductor is coupled to the redistribution layer through a plurality of solder bumps;
wherein the frame construct layer further comprises a recessed area, wherein some of the plurality of vias are positioned in the recess; and the first semiconductor device is positioned in the recessed area and coupled to the vias in the recessed area.

2. The device of claim 1, further comprising a portion of the recessed area and a portion of the first semiconductor device extending beyond the at least one side edge of the package substrate.

3. The device of claim 2, wherein the portion of the first semiconductor device extending beyond the at least one side edge of the package substrate is positioned over the second semiconductor device.

4. The device of claim 1, further comprising the interconnect frame forming an extension platform for the package substrate extending beyond at least a second side edge of the package substrate and the recessed area comprises a cavity exposing the top surface of the package substrate.

5. The device of claim 1, wherein the frame construct layer further comprises an embedded passive device.

6. The device of claim 5, wherein the first semiconductor device is positioned at least partially over the cavity, further comprising a plurality of solder bumps positioned in the cavity coupling the first semiconductor device to the top surface of the package substrate.

7. The device of claim 6, further comprising one or more additional recess semiconductor devices positioned in the recess and at least partially over the cavity, wherein the plurality of solder bumps couples the first semiconductor device and the one or more additional semiconductor devices to the top surface of the package substrate.

8. The device of claim 5, further comprising one or more additional frame semiconductor devices coupled to the bottom surface of the interconnect frame alongside of the package substrate.

9. The device of claim 5, further comprising an interposer coupled to the bottom surface of the interconnect frame alongside of the package substrate.

10. The device of claim 1, wherein the frame construct layer further comprises an integrated heat spreader.

11. The device of claim 1, wherein the frame construct layer further comprises an integrated electromagnetic shield.

12. A computing device comprising:
a printed circuit board;
a package substrate coupled to the printed circuit board, the package substrate comprising:
an interconnect frame extending beyond at least one side edge of the package substrate, the interconnect frame comprising a bottom surface positioned over and coupled to a top surface of the package substrate;
a first semiconductor device positioned at least partially over and coupled to the interconnect frame; and
a second semiconductor device positioned on the bottom surface of the interconnect frame alongside of the package substrate;
wherein the interconnect frame further comprises a redistribution layer and a frame construct layer;
further comprising a plurality of vias coupled to the redistribution layer, wherein the first device is coupled to the plurality of vias for connection to the redistribution layer and second semiconductor is coupled to the redistribution layer through a plurality of solder bumps;
wherein the frame construct layer further comprises a recess area, wherein some of the plurality of vias are positioned in the recess; and
the first semiconductor device is positioned in the recessed area and coupled to the vias in the recessed area.

13. The computing device of claim 12, further comprising:
the interconnect frame forming an extension platform for the package substrate extending beyond at least a second side edge of the package substrate;
the recessed area comprising a cavity exposing the top surface of the package substrate, wherein the first semiconductor device is positioned partially over the cavity; and
a plurality of solder bumps positioned in the cavity coupling the first semiconductor device to the top surface of the package substrate.

* * * * *